United States Patent
Fields et al.

(10) Patent No.: US 7,415,387 B2
(45) Date of Patent: Aug. 19, 2008

(54) DIE AND WAFER FAILURE CLASSIFICATION SYSTEM AND METHOD

(75) Inventors: Kevin L. Fields, Chester, VA (US); Timothy J. A. Bynum, Glen Allen, VA (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/612,541

(22) Filed: Dec. 19, 2006

(65) Prior Publication Data

US 2008/0147355 A1    Jun. 19, 2008

(51) Int. Cl.
G06F 11/30 (2006.01)
(52) U.S. Cl. .................... 702/183; 702/182; 702/185
(58) Field of Classification Search ............... None
See application file for complete search history.

(56) References Cited

U.S. PATENT DOCUMENTS

| | | | |
|---|---|---|---|
| 5,787,190 A * | 7/1998 | Peng et al. | 382/145 |
| 6,768,961 B2 | 7/2004 | Buckheit et al. | |
| 6,771,806 B1 | 8/2004 | Satya et al. | |
| 6,885,977 B2 | 4/2005 | Gavra et al. | |
| 6,947,806 B2 | 9/2005 | Wang | |
| 6,963,813 B1 | 11/2005 | Rathei et al. | |
| 6,980,873 B2 | 12/2005 | Shen | |
| 7,225,107 B2 * | 5/2007 | Buxton et al. | 702/183 |
| 2006/0171221 A1 * | 8/2006 | Mollat et al. | 365/201 |

* cited by examiner

Primary Examiner—Bryan Bui
Assistant Examiner—Jonathan Moffat
(74) Attorney, Agent, or Firm—Edell, Shapiro & Finnan, LLC

(57) ABSTRACT

A system and method for classifying failures of semiconductor integrated circuit dies using a unique input vector created from die level characterization data to classify wafer (process related) and die level (defect related) patterns. The failure classification may then be used to assign the appropriate yield loss by die. The classification results produced by the plurality of classifiers are examined with a preference towards assigning a wafer level failure classification to failure data for a die when any of the plurality of failure classification results indicates a presence of a wafer level failure.

23 Claims, 4 Drawing Sheets

| FAILURE CLASSIFICATION | COUNT | YIELD LOSS PERCENTAGE |
|---|---|---|
| WAFER CLASS 1 | 100 | .75332 |
| WAFER CLASS 2 | 24 | .1478 |
| ... | | |
| WAFER CLASS N | 3 | .0598 |
| DIE CLASS 1 | 10 | .1545 |
| DIE CLASS 2 | 22 | .2443 |
| ... | | |
| DIE CLASS M | 60 | .4332 |
| APPLICATION CLASS 1 | 25 | .2238 |
| APPLICATION CLASS 2 | 35 | .3244 |
| ... | | |
| APPLICATION CLASS P | 2 | .0566 |

DIE AND WAFER FAILURE CLASSIFICATION SYSTEM AND METHOD

BACKGROUND OF THE INVENTION

In the semiconductor manufacturing industry, semiconductor fabrication processes are used to make a wafer on which a plurality of integrated circuit dies are formed. A fabrication process is run to produce thousands (or more) parts and it is not uncommon to produce some dies that have irreparable defects or failures. The percentage of the integrated circuit dies produced that are operational is referred to as the "yield" of the process.

In order optimize the wafer/chip yield, a semiconductor manufacturer allocates engineers to analyze the yield of a process by grouping die failures into categories or classifications. Thus, one of the primary functions of a yield analysis engineer is to troubleshoot die failures, communicate the failure information and quantify the loss (impact on the yield) associated with the identified failure categories or classes. It is necessary to classify the failures before troubleshooting the failure causes.

Current failure classification techniques are completely manual. Engineers manually review failure pattern data to group wafer and die failures into categories and estimate yield loss based on the amount of loss that an engineer assigns to a lot. The amount of loss assigned to each failure class/category (also called a "detractor") is based on the engineer's judgment, and therefore is subjective.

There are several problems with the current manual failure classification techniques. Because the yield analysis engineer uses his/her subjective judgment to assign a loss amount to a detractor, there is inherently a bias on the detractors. Classification becomes more difficult and the yield detractor analysis less accurate as the yield increases and the semiconductor fabrication process matures.

SUMMARY OF THE INVENTION

Briefly, a system and method are provided for classifying failures of semiconductor integrated circuit dies using a unique input vector created from die level characterization data to classify wafer (process related) and die level (defect related) patterns. The failure classification may then be used to assign the appropriate yield loss by die. The classification results produced by the plurality of classifiers are examined with a preference towards assigning a wafer level failure classification to failure data for a die when any of the plurality of failure classification results indicates a presence of a wafer level failure. According to one embodiment, the failure data for each die is analyzed with a plurality of failure classifiers, including at least one die level classifier to produce a die level classification result and at least one wafer level classifier to produce a wafer level classification result. In one embodiment, a die level classifier uses a back-propagation neural network model. The model is tuned during an offline training phase during which failure data for known die failures are analyzed. Similarly, a wafer failure classification library is updated with failure data for known die failures. The neural network model and the wafer failure classification library are used during a failure classification and hierarchy phase to assign a failure classification to a plurality of integrated circuit dies.

DETAILED DESCRIPTION

Figure 1:
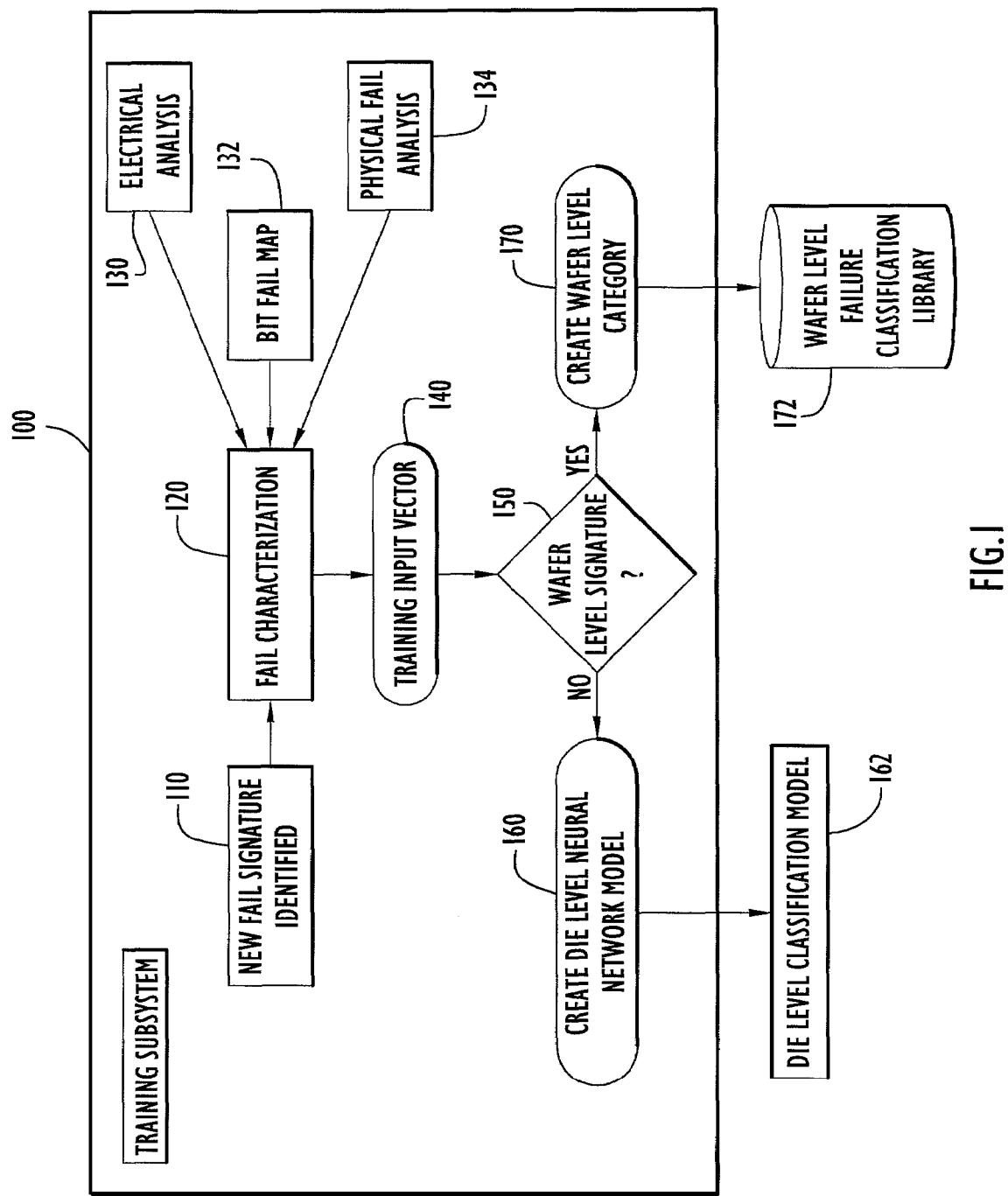
FIG. 1 is flow chart showing a training phase of the classification system and method according to an embodiment of the present invention.

Reference is made first to FIG. 1 which illustrates a training subsystem 100 or portion of a classification system and method according to an embodiment of the invention. The training subsystem 100 identifies and characterizes failure signatures using electrical analysis, die bitmap images and physical failure analysis to produce a training input vector. The training subsystem 100 is performed offline based on the various analyses also performed offline.

More specifically, when a new failure signature is identified at 110, the failure is characterized at 120 based on one or more of the electrical analysis 130, bit failure map 132 and physical failure analysis 134. The failure characterization 120 creates a training input vector 140 that represents the failure signature. The input vector comprises, for example, bin map classification data, failure chip compression data, die level IC current data associated with a known failure/defect. Next, at 150, the fail signature type for the training input vector 140 is determined. If at 150 it is determined that the training input vector is a wafer level signature type of failure, then it is coupled to block 170 where a wafer classifying pattern matching algorithm may be used to spatially compare the wafer failure signature data represented by the training input vector to known wafer patterns stored in a configuration file. A comparison match threshold may be based on a percentage of chips that match a particular pattern. The block 170 outputs a wafer classification for that training input vector for a known defect/failure to a wafer level classification library. If at 150 it is determined that the training input vector 140 is a die level failure, then the data for the training input vector is coupled to a die level neural network model at 160 for training a die level neural network classifier model. The output of the neural network model 160 is a predictive model markup language back-propagation model (NN PMML) 162. One example of a neural network technology that may be used is the well known Clementine neural network, information about which is publicly available. However, the present invention is not limited to this particular neural network and other such neural network technologies may be used.

Thus, a training input vector comprises test data, current data, etc., associated with a known failure/defect for a particular type of chip. The offline training subsystem 100 is executed on all of the known or identified failure signatures (at 110). Again, the outputs of the training subsystem 100 are updates to a wafer level classification library 172 and updates to the die level NN model in the form NN PMML 162. There may be several hundred training input vectors in a training set for a particular type of integrated circuit chip or die.

Figure 2:
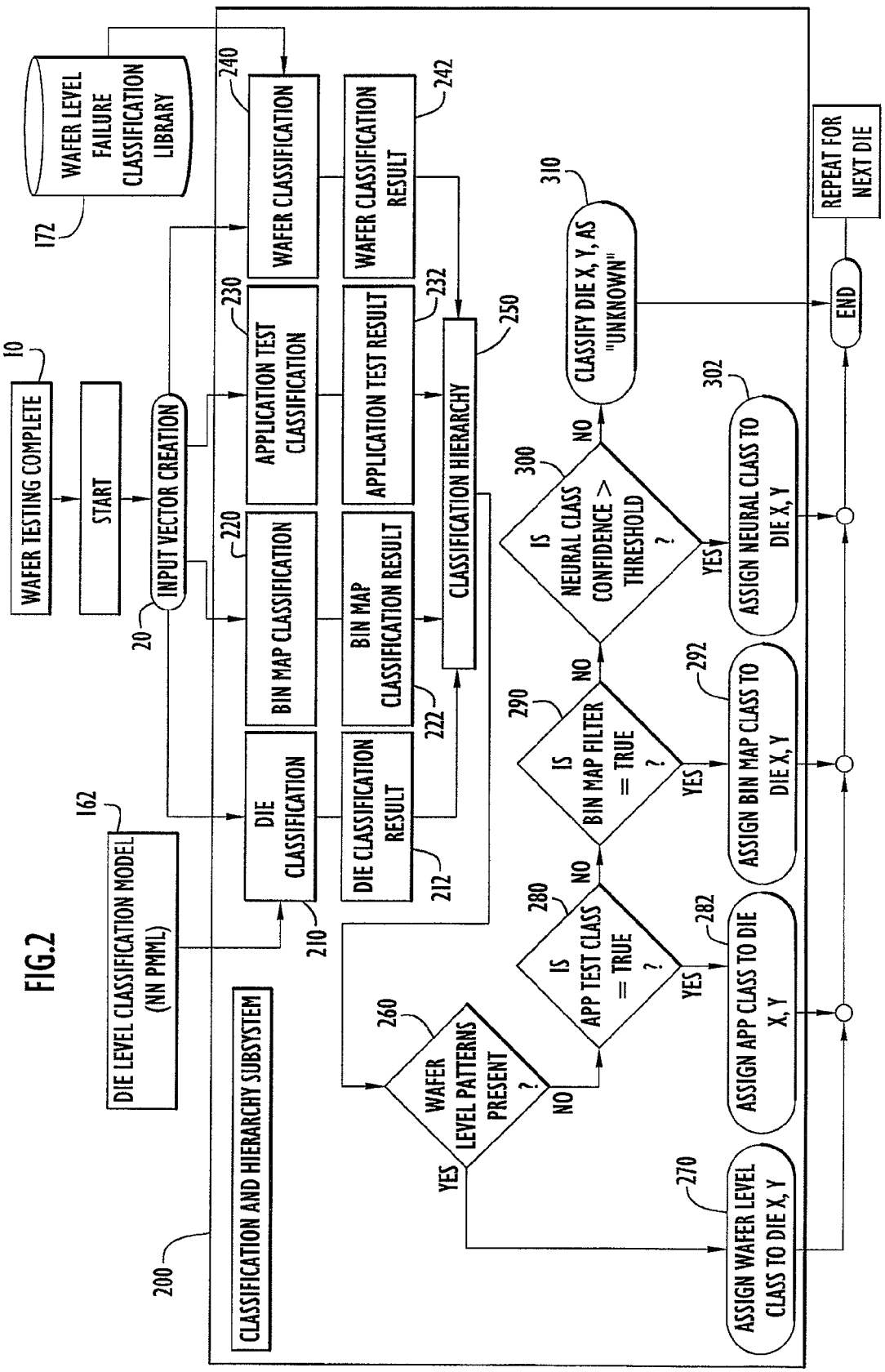
FIG. 2 is a flow chart showing a classification and hierarchy phase of the classification system and method according to an embodiment of the present invention.

Turning to FIG. 2, the classification and hierarchy subsystem 200 is described. After (prefuse) wafer testing 10 for a wafer is complete, the classification and hierarchy subsystem 200 takes information from the neural network model (NN PMML 162), and wafer level classification library 172 to classify each die failure signature resulting from the wafer testing 10, hereinafter referred to as a resultant die failure signature. Each resultant die failure signature is filtered through a common classification hierarchy to assign each die failure signature to its true failure classification and also looks for wafer level signatures from the die failure signatures. If there is a wafer level failure signature present on a particular wafer, then the classification assigned to a resultant die failure signature will be a wafer classification.

An input vector is created at 20 for each resultant die failure signature. The input vector is unique to a particular die X,Y on a wafer. The input vector is creating by combining failure chip compression data with chip characterization information derived from bit failure map data, electrical analysis data and physical failure analysis/test results. In essence, the input vector for a die is a set of raw failure data for which failure classification(s) is/are not known. The input vector is then coupled to a die classification step at 210, a bin map classification step at 220, an application test classification step at 230 and a wafer classification step at 240.

In the die classification step 210, a die failure classifier, implemented with a neural network model, analyzes data represented by the input vector and the NN PMML 162 to produce a die level classification result 212. The die level classification step 210 may be performed by a back-propagation neural network in one embodiment as indicated above. The die level classification result 212 is a measure or an indication of the degree to which the input vector is a die level failure and it is based on die information only for chips that have fail-chip compression data. As is known in the art, fail-chip compression data is a type of failure data that provides a spatial orientation of a failure density across a die. However, fail-chip compression data is not always available for a die. A die will not have fail-chip compression data if for some reason the die cannot be tested completely through the test flow process due to major failures. For example, common causes for the inability to produce fail-chip compression data for a die is the inability to make contact between the die and a tester device, more current or voltage is needed to test the die than is available in the tester device, etc. It is possible that may dies will not have fail-chip compression data resulting in the input vector for that die being devoid of data or having an incomplete set of data.

One solution is to replace the missing data in the input vector (caused by the lack of fail-chip compression data) with zeros. Nevertheless, when the die level neural network failure classifier 210 detects missing data in the input vector, the classifier 210 will output a system abort indicating an inability to classify the input vector or indicating an incorrect classification.

The bin map classifier 220 provides a solution to this data availability issue. The bin map classifier 220 checks bin map information and determines if the test results on the die indicate a test abort because the die could not be adequately tested. The bin map information is the initial die sorting data from the wafer tester process that groups dies into the following categories: DC test failures (continuity, short-circuits and open-circuits), output check failures (input leakage, pad-to-pad leakage), and functionality failures. Thus, the bin map information does not have fail chip compression information due to the test abort indication for a die. If the test results for a die indicate a test abort for that die, the failure classification assigned to that die is the bin map classification. In other words, the bin map classification result 222 is set to a "true" state for that die. The bin map classification may be viewed as another type of die level classification.

In the application test classification step 230, the input vector is analyzed to determine if an application specific or functional test failure (also known as product "guardbanding") is present. The application test result 232 is set to a "true" state for a die as an indication of an application specific or functional failure of that die.

Finally, the wafer classification step 240 involves performing pattern recognition analysis on the input vector using the wafer failure classification library 172 to determine and classify a wafer level failure signature in the input vector. The wafer classification step 240 recognizes the fail signature and its location on the wafer since it is specific to a particular X,Y die. The wafer classification result 242 is a measure or an indication of a known wafer level failure pattern in the input vector.

Next, the classification hierarchy step 250 analyzes the classification results 212, 222, 232 and 242 to determine the final classification for the die. The output of the classification hierarchy 250 is a classification for a die based on a hierarchy. In one embodiment, the classification hierarchy 250 gives preference or priority to wafer level signatures over all other failure signatures (die level and application). This approach is used since the die could be simultaneously involved in both a wafer fabrication process issue as well as a die defect issue.

For example, as shown at 260 if the wafer classification result 242 for a die indicates that there is a wafer level failure pattern in the input vector, the final classification assigned at 270 for that die is a wafer level classification. Next, if the classification results 212, 222, 232, and 242 for a die indicate that it is not a wafer level failure signature, the application classification result is examined at 280 and if the application test result 232 is sufficiently strong or true to indicate an application failure signature the final classification assigned at 282 for that die is an application failure signature. Proceeding further down the hierarchy, if the classification results 212, 22, 232, and 242 for a die indicate that it is not a wafer level failure signature and not an application failure signature, the bin map classification result is examined at 290 and if it is sufficiently strong or true the final classification assigned to that die is a bin map type die level failure signature. Finally, if the classification results 212, 22, 232, and 242 for a die indicate that it is not a wafer level failure signature, not an application failure signature, and not a bin map failure signature, then the die classification result is examined at 300 and a confidence value for the die classification result is greater than a threshold, the final classification assigned to that die at 302 is a die level classification of the fail chip compression type.

Finally, if at 300 it is determined that the classification result results classification result 212 does not exceed the confidence threshold, then at 310, the failure classification for die X,Y "unknown".

After steps 270, 282, 292, 302 and 310, the process ends for the input vector for a particular die X,Y, the process is then repeated for the input vector for another die on a wafer. There may be several different wafer level failure classifications (categories or classes), several types of application level failure classifications, several types of bin map die level failure classifications and several types of neural network die level failure classifications. Thus, each main category of failure classifications (wafer level, application level, bin map die level and neural network die level) may have sub-categories or classes. When a die is given a final classification through the processing of 260-310, it is assigned to the appropriate sub-category or class within that main classification. Thus, after the classification process is run for the input vectors for all of the dies on a wafer, the failure classification for each die is determined.

Figures 3, 4:
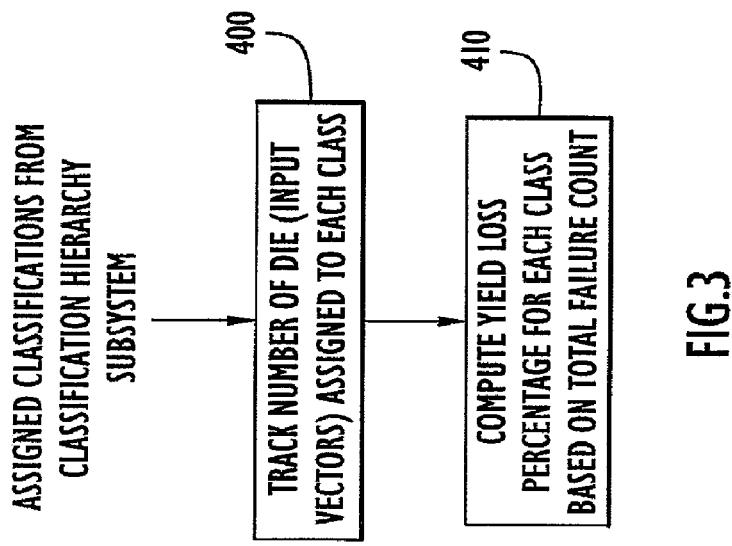
FIG. 3 is a flow chart showing how a yield loss percentage may be computed according to an embodiment of the present invention.
FIG. 4 illustrates exemplary data that may be produced according to the techniques of the present invention.

Reference is now made to FIGS. 3 and 4. One use of the data accumulated from the classification and hierarchy subsystem on a batch of wafers is to compute the yield loss percentage or fraction for each failure classification (class). The yield percentage may be computed over any number of wafers desired. The assigned classifications output by the classification and hierarchy subsystem is used at 400 to track the number of die (input vectors) that are assigned to each failure class, and in particular each main class and sub-class or sub-category. The count of the number of die assigned to each failure classification for a batch of wafers is tracked as shown in FIG. 4. Accordingly, at 410, the yield loss percentage for each failure class may be computed based on the total failure counts. For example, the yield loss percentage may be computed for each sub-class within a main failure classification. This is shown in FIG. 4 where for each of the wafer level sub-categories or classes Wafer Class 1 to Wafer Class N, the yield loss percentage is computed relative to the total count of die assigned to all wafer level classes (Wafer Class 1 to Wafer Class N). The yield loss percentage may be similarly computed for each of the die level failure sub-categories Die Class 1 to Die Class M and for each of the application level failure sub-categories Application Class 1 to Application Class P. Alternatively, the yield loss percentage for each sub-category may be computed across all failure classifications. In any event, using the foregoing techniques, it is possible to classify wafer level (process related) and die level (defect related) failure patterns and assign the appropriate yield loss by die.

Figure 5:
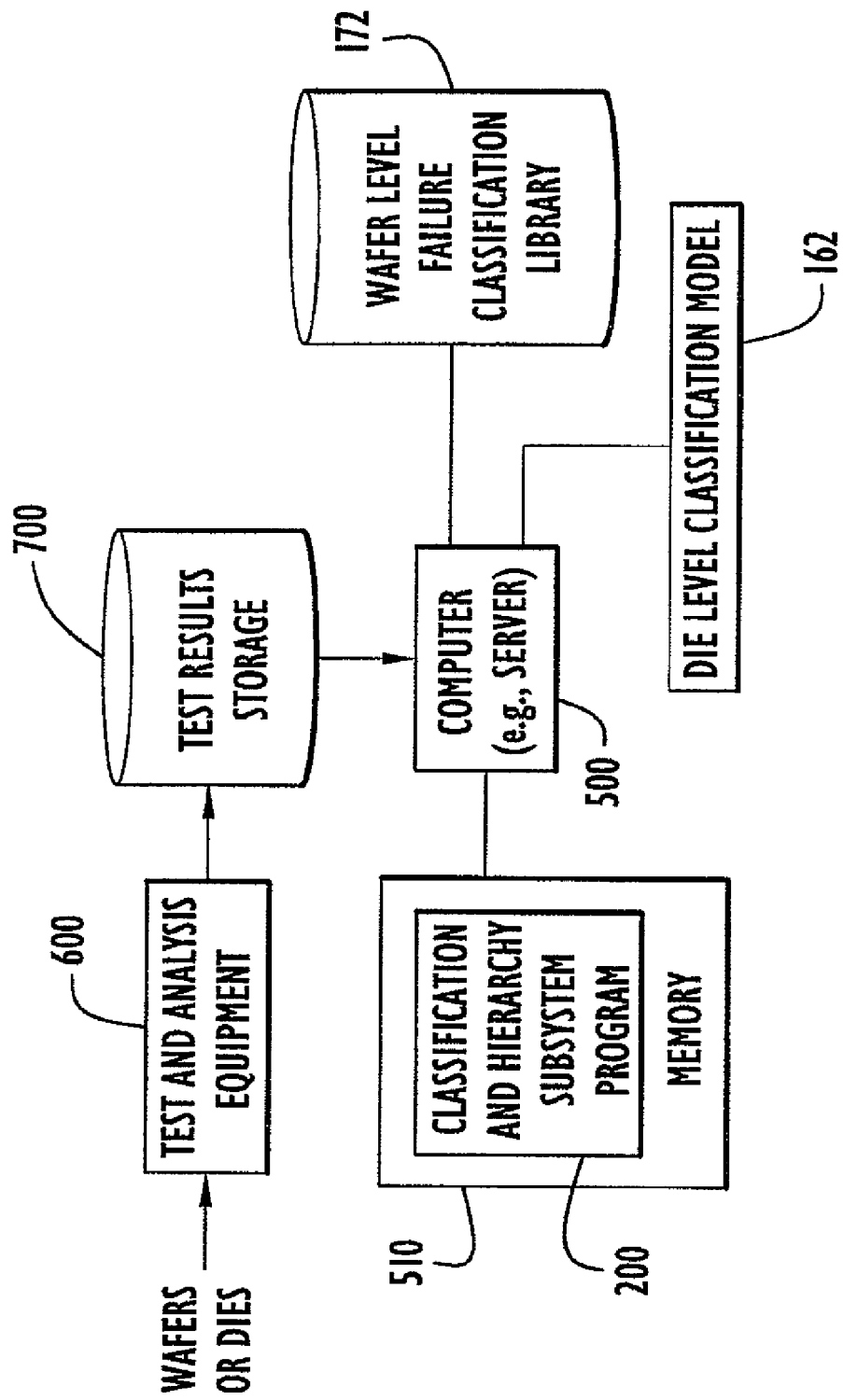
FIG. 5 is a system block diagram of a semiconductor fabrication failure classification system according to an embodiment of the present invention.

FIG. 5 illustrates how the classification techniques described above may be used as part of a semiconductor yield analysis system. The classification and hierarchy subsystem 200 is a computer program that is stored in a memory 510 associated with a computer 500. The computer 500 is also connected to the wafer level failure classification library 172 and the die level classification model 162. It is assumed that the training subsystem 100 has already been run for numerous known failures. Wafers or individual dies are tested and analyzed using test and analysis equipment 600, producing test results which are stored in a data store or database 700. The computer 500 executes the classification and hierarchy subsystem program to classify the input vectors for the data in database 700 associated with each die. The computer 500 may also perform the computations described above in connection with FIGS. 3 and 4 to compute yield loss by failure classification.

The failure classification system and method described herein may be used for any type of semiconductor integrated circuit device, such as memory devices, application specific integrated circuit devices, processors, etc.

The system and methods described herein may be embodied in other specific forms without departing from the spirit or essential characteristics thereof. The foregoing embodiments are therefore to be considered in all respects illustrative and not meant to be limiting.

What is claimed is:

1. A method for classifying failures of integrated circuit dies, comprising:
   analyzing failure data for each of a plurality of dies on a wafer with a plurality of failure classifiers to produce a corresponding plurality of failure classification results for each die, wherein the failure data for each die combines bin map failure data, electrical analysis data and physical failure data for the die; and
   for the failure data for each die, analyzing the plurality of failure classification results to assign a particular one of a plurality of failure classifications to each die, wherein analyzing comprises analyzing the plurality of failure classification results with a preference towards assigning a wafer level failure classification to failure data for a die when any of the plurality of failure classification results indicates a presence of a wafer level failure.

2. The method of claim 1, and further comprising counting the number of die assigned to each of the plurality of failure classifications.

3. The method of claim 1, wherein analyzing comprises analyzing the failure data for each die with at least one die level classifier to produce a die level classification result and with at least one wafer level classifier to produce a wafer level classification result.

4. A method for classifying failures of integrated circuit dies, comprising:
   analyzing failure data for each of a plurality of dies on a wafer with a plurality of failure classifiers to produce a corresponding plurality of failure classification results for each die, wherein the failure data for each die combines bin map failure data, electrical analysis data and physical failure data for the die; and
   for the failure data for each die, analyzing the plurality of failure classification results to assign a particular one of a plurality of failure classifications to each die;
   counting the number of die assigned to each of the plurality of failure classifications; and
   computing a yield loss percentage for each of the plurality of failure classifications based on the number of die assigned to each of the plurality of failure classifications.

5. A method for classifying failures of integrated circuit dies, comprising:
   analyzing failure data for each of a plurality of dies on a wafer with a plurality of failure classifiers to produce a corresponding plurality of failure classification results for each die, wherein the failure data for each die combines bin map failure data, electrical analysis data and physical failure data for the die; and
   for the failure data for each die, analyzing the plurality of failure classification results to assign a particular one of a plurality of failure classifications to each die, wherein analyzing comprises analyzing the failure data for each die with at least one die level classifier to produce a die level classification result and with at least one wafer level classifier to produce a wafer level classification result, and analyzing the die level classification result and the wafer level classification result with a preference towards assigning a wafer level failure classification to the failure data when the wafer level classification result indicates presence of a wafer level failure for the die regardless of the die level classification result for that die.

6. A method for classifying failures of integrated circuit dies, comprising:
   analyzing failure data for each of a plurality of dies on a wafer with a plurality of failure classifiers to produce a corresponding plurality of failure classification results for each die, wherein the failure data for each die combines bin map failure data, electrical analysis data and physical failure data for the die; and
   for the failure data for each die, analyzing the plurality of failure classification results to assign a particular one of a plurality of failure classifications to each die, wherein analyzing comprises analyzing the failure data for each die with at least one die level classifier to produce a die level classification result and with at least one wafer level classifier to produce a wafer level classification result, wherein analyzing comprises analyzing the failure data for a die with a first die level classifier that analyzes data describing a spatial orientation of a failure density across a die, and analyzing the failure data for a die with a second die level classification that analyzes whether the die could not be sufficiently tested during wafer level testing.

7. A method for classifying failures of integrated circuit dies, comprising:
   a. receiving a set of failure data for each of a plurality of integrated circuit dies, wherein the set of failure data for each die combines bin map failure data, electrical analysis failure data and physical failure data for the die;
   b. analyzing each set of failure data with a die level classifier to produce a die level classification result indicating the degree to which the failure data contains a die level failure;
   c. analyzing each set of failure data with a wafer level classifier to produce a wafer level classification result indicating the degree to which the failure data contains a wafer level failure; and
   d. for each set of failure data, analyzing the die level classification result and the wafer level classification result to assign a particular one of a plurality of failure classifications for each integrated circuit die.

8. The method of claim 7, and further comprising receiving a set of training failure data for each of a plurality of known failures determined for a plurality of integrated circuit dies; for each set of training failure data assigning a wafer level classification to the set of training failure data when the set of training failure data indicates a wafer level failure, generating a library of wafer level failure classifications from a plurality of sets of training failure data obtained for a plurality of integrated circuit dies; and wherein (c) analyzing comprises analyzing the set of failure data with the wafer level classifier with reference to the wafer level classification library.

9. The method of claim 7, wherein the die level classifier employs a neural network model, and further comprising updating the neural network model with die level failure classifications from sets of training failure data that do not indicate a wafer level failure, wherein (c) analyzing comprises analyzing the set of failure data using the neural network model.

10. The method of claim 9, wherein (d) analyzing comprises analyzing the die level classification result and the wafer level classification result and assigning a die level failure classification to a set of failure data only when the wafer level classification result indicates that there is no presence of a wafer level signature.

11. The method of claim 7, wherein (d) analyzing comprises analyzing the die level classification result and the wafer level classification result with a preference towards assigning a wafer level failure classification to the set of failure data when the wafer level classification result indicates a presence of a wafer level failure.

12. The method of claim 7, and further comprising analyzing each set of failure data with an application level classifier to produce an application level classification result indicating the degree to which the set of failure data contains an application or functional level failure, and wherein (d) analyzing comprises analyzing the die level classification result, the wafer level classification result and the application level classification result to assign a wafer level classification to the set of failure data when the wafer level classification result indicates a presence of a wafer level signature regardless of the die level classification and application level classification result.

13. The method of claim 12, wherein (d) analyzing comprises assigning an application level classification to the set of failure data when the wafer level classification result does not indicate a presence of a wafer level signature and the application level classification result indicates existence of an application level failure regardless of the die level classification result.

14. The method of claim 12, wherein (d) analyzing comprises assigning a die level classification to the set of failure data when the wafer level classification result does not indicate a presence of a wafer level signature, the application level classification result does not indicate existence of an application level failure and the die level classification result indicates existence of a die level failure.

15. The method of claim 7, and further comprising counting the number of sets of failure data assigned to each of the plurality of failure classifications.

16. The method of claim 15, and further comprising computing a yield loss percentage for each of the plurality of failure classifications.

17. The method of claim 7, wherein (b) analyzing comprises analyzing each set of failure data with a first die level classifier that analyzes data describing a spatial orientation of a failure density across a die, and analyzing each set of failure data with a second die level classification that analyzes whether the die could not be sufficiently tested during wafer level testing.

18. A computer readable medium storing instructions, that when executed by a computer, cause the computer to classify failures of integrated circuit dies, comprising functions of:
   a. receiving a set of failure data for each of a plurality of integrated circuit dies, wherein the set of failure data for each die combines bin map failure data, electrical analysis failure data and physical failure data for the die;
   b. analyzing each set of failure data with at least one die level classifier to produce a die level classification result indicating the degree to which the failure data contains a die level failure and with at least one wafer level classifier to produce a wafer level classification result indicating the degree to which the failure data contains a wafer level failure; and
   c. for each set of failure data, analyzing the die level classification result and the wafer level classification result to assign a particular one of a plurality of failure classifications for each integrated circuit die.

19. The computer readable medium of claim 18, and further comprising instructions, that when executed by said computer, cause said computer to perform, during an offline training phase, functions of: receiving a set of training failure data for each of a plurality of known failures determined for a plurality of integrated circuit dies; for each set of training failure data assigning a wafer level classification to the set of training failure data when the set of training failure data indicates a wafer level failure, generating a library of wafer level failure classifications from a plurality of sets of training failure data obtained for a plurality of integrated circuit dies; and wherein the instructions for (b) analyzing comprises instructions for analyzing the set of failure data with the wafer level classifier with reference to the wafer level classification library.

20. The computer readable medium of claim 18, wherein the instructions for (b) analyzing comprise instructions that, when executed by said computer, cause said computer to execute the die level classifier using a neural network model, and further comprising instructions, that when executed by said computer, cause said computer to perform, during the offline training phase, functions of: updating the neural network model with die level failure classifications from sets of training failure data that do not indicate a wafer level failure.

21. A system for classifying failures of integrated circuit dies, comprising:
   a. a computing device;
   b. a wafer level failure classification library that contains a plurality of wafer level failure classifications;
   c. a die level classification model that contains data used to classify failure data to one of a plurality of die level failure classifications;
   d. wherein the computing device, during an offline training phase: analyzes a set of training failure data for each of a plurality of known failures determined for a plurality of semiconductor integrated circuit dies and for each set of training failure data assigns a wafer level classification to the set of training failure data when the set of training failure data indicates a wafer level failure and accordingly updates the wafer level classification library, and updates the die level classification model with die level failure classifications from sets of training failure data that do not indicate a wafer level failure; and
   e. wherein for a set of failure data for each of a plurality of integrated circuit dies whose failure classification is not yet known, the computing device:
      i. analyzes each set of failure data with the die level classification model to produce a die level classification result indicating the degree to which the failure data contains a die level failure;
      ii. analyzes each set of failure data with a wafer level classifier using the wafer level classification library to produce a wafer level classification result indicating the degree to which the failure data contains a wafer level failure; and
      iii. for each set of failure data, analyzing the die level classification result and the wafer level classification result to assign a particular one of a plurality of failure classifications for each integrated circuit die.

22. The system of claim 21, wherein the computing device analyzes the die level classification result and the wafer level classification result with a preference towards assigning a wafer level failure classification to the set of failure data when any the wafer level classification result indicates a presence of a wafer level failure.

23. The system of claim 21, wherein the computing device further counts the number of sets of failure data assigned to each of the plurality of failure classifications, and computes a yield loss percentage for each of the plurality of failure classifications.

* * * * *